United States Patent
Yu et al.

(10) Patent No.: US 9,824,964 B2
(45) Date of Patent: Nov. 21, 2017

(54) PACKAGE SUBSTRATE, PACKAGE STRUCTURE INCLUDING THE SAME, AND THEIR FABRICATION METHODS

(71) Applicant: PHOENIX PIONEER TECHNOLOGY CO., LTD., Hsinchu County (TW)

(72) Inventors: Chun-Hsien Yu, Hsinchu County (TW); Shih-Ping Hsu, Hsinchu County (TW)

(73) Assignee: PHOENIX PIONEER TECHNOLOGY CO., LTD., Hsinchu County (TW)

( * ) Notice: Subject to any disclaimer, the term of this patent is extended or adjusted under 35 U.S.C. 154(b) by 0 days.

(21) Appl. No.: 15/624,855

(22) Filed: Jun. 16, 2017

(65) Prior Publication Data

US 2017/0287815 A1    Oct. 5, 2017

Related U.S. Application Data

(62) Division of application No. 15/054,861, filed on Feb. 26, 2016, now Pat. No. 9,711,445.

(30) Foreign Application Priority Data

Mar. 6, 2015   (TW) .............................. 104107240 A

(51) Int. Cl.
*H01L 21/00* (2006.01)
*H01L 23/498* (2006.01)

(52) U.S. Cl.
CPC .... *H01L 23/4985* (2013.01); *H01L 23/49861* (2013.01); *H01L 23/49822* (2013.01); *H01L 23/49827* (2013.01)

(58) Field of Classification Search
CPC .......... H01L 23/4985; H01L 23/49822; H01L 23/49827
USPC ........................................ 438/108, 613, 125
See application file for complete search history.

(56) References Cited

U.S. PATENT DOCUMENTS

| 5,111,278 A | 5/1992 | Eichelberger |
| 5,350,947 A * | 9/1994 | Takekawa ............. H01L 21/563 |
| | | 257/668 |
| 5,757,078 A | 5/1998 | Matsuda et al. |
| 5,821,626 A * | 10/1998 | Ouchi ............... H01L 23/49816 |
| | | 257/778 |

(Continued)

*Primary Examiner* — Nitin Parekh
(74) *Attorney, Agent, or Firm* — WPAT, PC

(57) ABSTRACT

This disclosure provides a package substrate, a package structure including the same and their fabrication methods. The package substrate comprises: a first wiring layer having a first metal wire and a first dielectric material layer surrounding the first metal wire; a conductive pillar layer formed on the first wiring layer and including a first metal pillar connected to the first metal wire and a molding compound layer surrounding the first metal pillar; a flexible material layer formed on the conductive pillar layer and including a first opening formed on the first metal pillar and exposing the first metal pillar; and a second wiring layer formed on the conductive pillar layer and including a second metal wire connected to the first metal pillar through the first opening, a second metal pillar formed on the second metal wire, and a protective layer surrounding the second metal wire and the second metal pillar.

6 Claims, 7 Drawing Sheets

(56) References Cited

U.S. PATENT DOCUMENTS

| | | | | |
|---|---|---|---|---|
| 5,897,337 | A | * | 4/1999 | Kata ..................... H01L 21/563 |
| | | | | 257/E21.503 |
| 5,985,695 | A | * | 11/1999 | Freyman ............. H01L 23/3128 |
| | | | | 257/668 |
| 6,271,469 | B1 | * | 8/2001 | Ma .......................... H01L 21/56 |
| | | | | 174/521 |
| 6,590,291 | B2 | | 7/2003 | Akagawa |
| 7,830,004 | B2 | | 11/2010 | Wu |
| 9,219,027 | B2 | | 12/2015 | Chew et al. |
| 2002/0070064 | A1 | | 6/2002 | Hormann et al. |
| 2002/0180041 | A1 | * | 12/2002 | Sahara ..................... H01L 23/36 |
| | | | | 257/738 |
| 2007/0141757 | A1 | * | 6/2007 | Nomura ................ H01L 21/486 |
| | | | | 438/125 |
| 2008/0185705 | A1 | * | 8/2008 | Osborn ............. H01L 23/49811 |
| | | | | 257/690 |
| 2008/0224306 | A1 | | 9/2008 | Yang |
| 2008/0237589 | A1 | | 10/2008 | Negishi |
| 2008/0246126 | A1 | | 10/2008 | Bowles et al. |
| 2015/0357302 | A1 | | 12/2015 | Chen et al. |
| 2016/0007486 | A1 | * | 1/2016 | Kim ..................... H05K 5/0095 |
| | | | | 361/757 |
| 2016/0183376 | A1 | * | 6/2016 | Gowda ................... H01L 24/19 |
| | | | | 361/783 |
| 2016/0240462 | A1 | * | 8/2016 | Chen ................ H01L 23/49816 |

* cited by examiner

PACKAGE SUBSTRATE, PACKAGE STRUCTURE INCLUDING THE SAME, AND THEIR FABRICATION METHODS

This application claims the benefit of Taiwan application Serial No. 104107240, filed Mar. 6, 2015, the disclosure of which is incorporated by reference herein in its entirety.

FIELD OF THE INVENTION

The present invention relates to a package substrate, a package structure including the package substrate, and their fabrication methods.

BACKGROUND OF THE INVENTION

As recent rapid trend in modern electronic devices is not only toward thinner, lighter and smaller devices, but also toward multifunctional and high-performance devices, the fabrication and technology of integrated circuits (ICs) has to evolve correspondingly toward a more high-density and miniature design so as to allow more electronic components to be received inside limited chip space. Consequently, the relating IC package substrate and the package technology are evolved accordingly to meet the trend.

FIG. 1 illustrates a package structure 10 commonly used in the art of molded interconnection substrate (MIS). The package structure 10 formed on a substrate 11 includes a lower-layer wiring 12, an upper-layer wiring 14, copper pillars 18 connecting the lower-layer wiring 12 and the upper-layer wiring 14, and a molding compound layer 16 covering the lower-layer wiring 12 and surrounding the copper pillars 18. Wherein, the molding compound layer 16 is made of a rigid material which is fragile after curing, so that the package structure 10 is subject to damage in its fabrication process. Also, the forming material of the molding compound layer 16 is not compatible with metal such as copper, and this may deteriorate the reliability of the upper-layer wiring 14. Even though a photo-sensitive material such as primer, can be coated on the molding compound layer 16 to facilitate the formation of the upper-layer wiring 14, the package structure 10 is subject to fragility and thus low product yield. Therefore, it is in need of a new and advanced packaging solution.

SUMMARY OF THE INVENTION

According to one aspect of the present disclosure, one embodiment provides a package substrate, which comprises: a first wiring layer having a first metal wire and a first dielectric material layer surrounding the first metal wire; a conductive pillar layer formed on the first wiring layer and including a first metal pillar connected to the first metal wire and a molding compound layer surrounding the first metal pillar; a flexible material layer formed on the conductive pillar layer and including a first opening formed on the first metal pillar and exposing the first metal pillar; and a second wiring layer formed on the conductive pillar layer and including a second metal wire connected to the first metal pillar through the first opening, a second metal pillar formed on the second metal wire, and a protective layer surrounding the second metal wire and the second metal pillar.

According to one aspect of the present disclosure, one embodiment provides a package structure comprising: a first wiring layer having a first metal wire and a first dielectric material layer surrounding the first metal wire; a conductive pillar layer formed on the first wiring layer and including a first metal pillar connected to the first metal wire, a molding compound layer surrounding the first metal pillar, and a multi-layer circuit device connected to the first metal wire and surrounded by the molding compound layer; a flexible material layer formed on the conductive pillar layer and including a first opening formed on the first metal pillar and exposing the first metal pillar; and a second wiring layer formed on the conductive pillar layer and including a second metal wire connected to the first metal pillar through the first opening, a second metal pillar formed on the second metal wire, and a protective layer surrounding the second metal wire and the second metal pillar.

According to one aspect of the present disclosure, one embodiment provides a package substrate comprising: a first wiring layer having a first metal wire and a first dielectric material layer surrounding the first metal wire; a conductive pillar layer formed on the first wiring layer and including a first metal pillar connected to the first metal wire and a molding compound layer surrounding the first metal pillar; a flexible material layer formed on the molding compound layer and including a first opening formed on the first metal pillar and exposing the first metal pillar; and a second wiring layer formed on the conductive pillar layer and including a second metal wire connected to the first metal pillar through the first opening, a second opening formed on the second metal wire and exposing the second metal wire, and a protective layer surrounding the second metal wire and the second opening; wherein the flexible material layer has an area larger than that of the molding compound layer.

According to one aspect of the present disclosure, one embodiment provides a package structure comprising: a first wiring layer having a first metal wire and a first dielectric material layer surrounding the first metal wire; a conductive pillar layer formed on the first wiring layer and including a first metal pillar connected to the first metal wire, a molding compound layer surrounding the first metal pillar, and a multi-layer circuit device connected to the first metal wire and surrounded by the molding compound layer; a flexible material layer formed on the molding compound layer and including a first opening formed on the first metal pillar and exposing the first metal pillar; and a second wiring layer formed on the conductive pillar layer and including a second metal wire connected to the first metal pillar through the first opening, a second opening formed on the second metal wire and exposing the second metal wire, and a protective layer surrounding the second metal wire and the second opening; wherein the flexible material layer has an area larger than that of the molding compound layer.

According to one aspect of the present disclosure, one embodiment provides a method for fabricating a package structure, comprising the steps of: providing a carrier; forming a metal wiring layer on the carrier, and patterning the metal wiring layer to form a first metal wire; forming a first dielectric material layer on the carrier while enabling the first metal wire to be exposed; forming a metal pillar on the first dielectric material layer, so that the metal pillar is electrically connected to the first metal wire; forming a molding compound layer on the first dielectric material layer while enabling an upper surface of the metal pillar to be exposed; forming a flexible material layer on the molding compound layer while enabling the upper surface of the metal pillar to be exposed; forming a second metal wire on the flexible material layer and on the upper surface of the metal pillar, so that the second metal wire is connected to the metal pillar; and forming a protective layer to cover the flexible material layer and the second metal wire, and forming an opening to expose the second metal wire.

According to one aspect of the present disclosure, one embodiment provides a method for fabricating a package structure, comprising the steps of: providing a carrier; forming a metal wiring layer on the carrier, and patterning the metal wiring layer to form a first metal wire; forming a first dielectric material layer on the carrier while enabling the first metal wire to be exposed; forming a metal pillar on the first dielectric material layer, so that the metal pillar is electrically connected to the first metal wire; forming a molding compound layer on the first dielectric material layer while enabling an upper surface of the metal pillar to be exposed; forming a flexible material layer on the molding compound layer while enabling the upper surface of the metal pillar to be exposed; forming a second metal wire on the flexible material layer and on the upper surface of the metal pillar, so that the second metal wire is connected to the metal pillar; forming a protective layer to cover the flexible material layer and the second metal wire, and forming an opening to expose the second metal wire; and electrically connecting an integrated-circuit chip to the first metal wire.

Further scope of applicability of the present application will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below and the accompanying drawings which are given by way of illustration only, and thus are not limitative of the present invention and wherein:

FIG. 6-8, FIG. 9B, FIG. 10B and FIG. 11B are sectional views of the package substrate in different steps of the fabrication method according to the second embodiment.

DESCRIPTION OF THE EXEMPLARY EMBODIMENTS

For your esteemed members of reviewing committee to further understand and recognize the fulfilled functions and structural characteristics of the invention, several exemplary embodiments cooperating with detailed description are presented as the follows.

In the following embodiments of the present disclosure, when an element is described to be disposed above/ mounted on top of or below/ under another element, it comprises either the element is directly or indirectly disposed above/ below the other element, i.e. when indirectly, there can be some other element arranged between the two; and when directly, there is no other element disposed between the two. It is noted that the descriptions in the present disclosure relate to "above" or "below" are based upon the related diagrams provided, but are not limited thereby. Moreover, the terms "first", "second", and "third", and so on, are simply used for clearly identifying different elements of the same nature, but those elements are not restricted thereby and must be positioned or arranged accordingly. In addition, the size or thickness of each and every element provided in the following diagrams of the present disclosure is only schematic representation used for illustration and may not represent its actual size.

Figure 1:
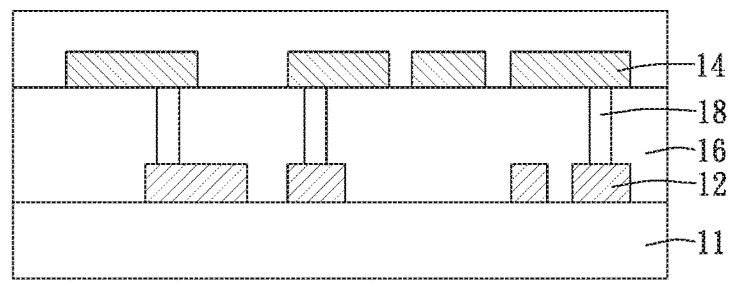
FIG. 1 illustrates a package structure commonly used in the art of molded interconnection substrate (MIS).
Figure 2:
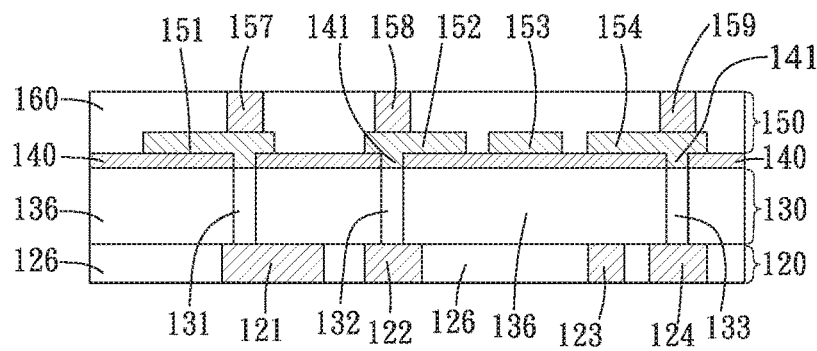
FIG. 2 is a cross-sectional view of a package substrate according to a first embodiment of the present invention.

Please refer to FIG. 2, which is a cross-sectional view of a package substrate 100 according to a first embodiment of the present invention. The package substrate 100 comprises: a first wiring layer 120, a conductive pillar layer 130, a flexible material layer 140, and a second wiring layer 150. As shown in FIG. 2, the first wiring layer 120 includes a first dielectric material layer 126 and at least one first metal wire 121-124 which is formed by patterning a metal layer and acts as lower-layer conductive wiring of the package substrate 100. Wherein, the first dielectric material layer 126 surrounds the first metal wires 121-124; in other words, the first dielectric material layer 126 fills the remaining part of the first wiring layer 120 other than the occupation of the first metal wires 121-124.

The conductive pillar layer 130 is formed on the first wiring layer 120 and includes at least one metal pillar 131-133 and a molding compound layer 136. Wherein, the metal pillars 131-133 are formed by patterning a metal layer and used to connect the first wiring layer 120 and the second wiring layer 150. As shown in FIG. 2, the molding compound layer 136 is formed on the first wiring layer 120, the metal pillars 131, 132 and 133 are respectively connected to the first metal wires 121, 122 and 124, and the molding compound layer 136 surrounds each of the metal pillars 131-133. In other words, the molding compound layer 136 fills the remaining part of the conductive pillar layer 130 other than the occupation of the metal pillars 131-133. The molding compound layer 136 may be made of insulating material suitable for molding, such as epoxy-based-resin molding compound (EMC) and polyimide (PI).

The flexible material layer 140, which includes first openings 141 each formed on one of the first metal pillars 131-133 to expose the first metal pillars 131-133, is formed on the conductive pillar layer 130. The first openings 141 can be formed in the flexible material layer 140 by any proper patterning means. For example, the flexible material layer 140 may come with through-holes and with pressure sensitive adhesive on its bottom side. The flexible material layer 140 is then put on the conductive pillar layer 130 and the through-holes become the first openings 141. In another example, the flexible material layer 140 can be first laminated on the conductive pillar layer 130 and then patterned to form the first openings 141. The flexible material layer 140 can be made of flexible material, such as polyimide (PI), polyethylene naphthalate (PEN), or liquid crystal plastic (LCP). Because the flexible material layer 140 is bond together to the molding compound layer 136, the elasticity and flexibility of the flexible material layer 140 can prevent the molding compound layer 136 from being fragile and damaged.

The second wiring layer 150, including at least one second metal wire 151-154, at least one second metal pillar 157-159 and a protective layer 160, can be formed on the flexible material layer 140. Wherein, the second metal wires 151-154 are formed by patterning a metal layer acting as upper-layer conductive wires of the package substrate 100. Metal material is used to form the second wiring layer 150. The metal material also fills the first openings 141 during the formation of the second wiring layer 150, so that the second metal wires 151, 152 and 154 are connected to the metal pillars 131, 132 and 133, respectively, through the first openings 141. In the embodiment, the metal pillars 131-133 may be made of copper, so as to electrically connect the second wiring layer 150 (the upper circuit layer) and the first wiring layer 120 (the lower circuit layer). The second metal pillars 157-159 can be formed on the second metal wires 151, 152 and 154, respectively, by any proper patterning means, so that the package substrate 100 can be connected to an external circuit. Moreover, the protection layer 160 is formed of insulating material and surrounds the second metal wires 151-154 and the second metal pillars 157-159. The protection layer 160 may be the outermost part or the bottom of the package substrate 100, so as to protect the package substrate 100 from being damaged by external objects or the subsequent fabrication process like soldering. The package substrate 100 can be a flip-chip chip size package (FCCSP) substrate used to construct the molded interconnection substrate (MIS).

In one embodiment, the first wiring layer 120 may be filled with the material forming the molding compound layer 136, other than the occupation of the first metal wires 121-124. That is, the forming material of the first dielectric layer 126 may be selected to be that of the molding compound layer 136.

Figure 3:
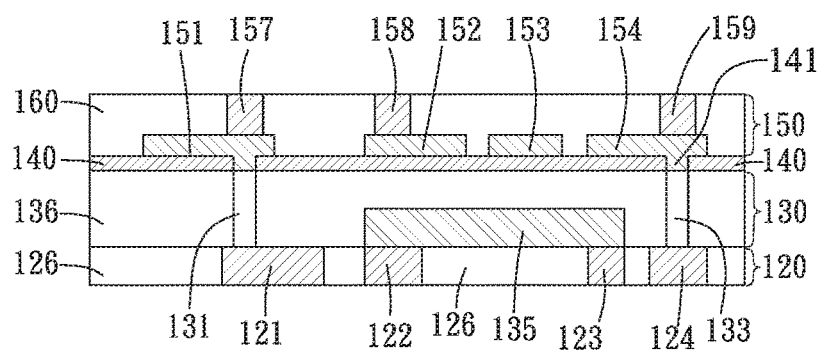
FIG. 3 schematically shows a cross-sectional view of a package substrate according to a further embodiment.

FIG. 3 schematically shows a cross-sectional view of a package substrate 101 according to a further embodiment. The package substrate 101 is in many ways identical to the package substrate 100 shown in FIG. 2. However, in contrast to the package substrate 100, the package substrate 101 includes a multi-layer circuit device 135 in the conductive pillar layer 130, e.g. multi-layer ceramic capacitor (MLCC) connected to the first metal wires 122 and 123 and surrounded by the molding compound layer 136.

Figure 4:
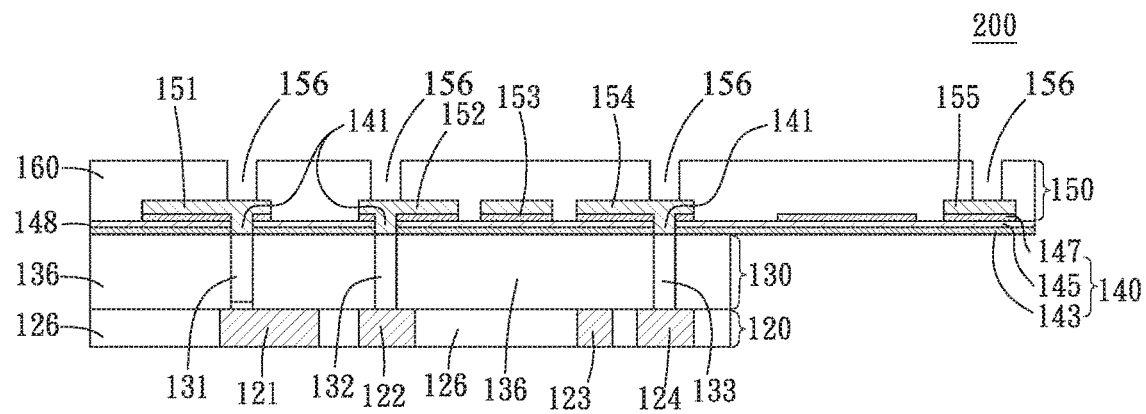
FIG. 4 illustrates a cross-sectional view of a package substrate according to a second embodiment of the present invention.

FIG. 4 illustrates a cross-sectional view of a package substrate 200 according to a second embodiment of the present invention. The package substrate 200 comprises: a first wiring layer 120, a conductive pillar layer 130, a flexible material layer 140, and a second wiring layer 150. As shown in FIG. 4, the first wiring layer 120 includes a first dielectric material layer 126 and at least one first metal wire 121-124 which is formed by patterning a metal layer and acts as lower-layer conductive wiring of the package substrate 100. Wherein, the first dielectric material layer 126 surrounds the first metal wires 121-124; in other words, the first dielectric material layer 126 fills the remaining part of the first wiring layer 120 other than the occupation of the first metal wires 121-124.

The conductive pillar layer 130 is formed on the first wiring layer 120 and includes at least one metal pillar 131-133 and a molding compound layer 136. Wherein, the metal pillars 131-133 are formed by patterning a metal layer and used to connect the first wiring layer 120 and the second wiring layer 150. As shown in FIG. 4, the molding compound layer 136 is formed on the first wiring layer 120, the metal pillars 131, 132 and 133 are respectively connected to the first metal wires 121, 122 and 124, and the molding compound layer 136 surrounds each of the metal pillars 131-133. In other words, the molding compound layer 136 fills the remaining part of the conductive pillar layer 130 other than the occupation of the metal pillars 131-133. The molding compound layer 136 may be made of insulating material suitable for molding, such as PI and EMC.

The flexible material layer 140 may be structured in multi-layers, e.g. flexible copper clad laminate (FCCL), having an adhesive layer 143, a second dielectric material layer 145 formed on the adhesive layer 143, and a conductive material layer 147 formed on the second dielectric material layer 145. In one embodiment, the flexible material layer 140 may be an FCCL including PI or LCP; wherein, the conductive material layer 147 is formed of copper, and the second dielectric material layer 145 is formed of PI or LCP and acts as a substrate mechanically supporting conductive tracks, e.g. the second metal wires 151-155 in FIG. 4. In the field of art, a rigid-flex circuit is referred to a hybrid circuit consisting of rigid and flexible substrates which are laminated together to be a single structure. Thus, a rigid-flex printed-circuit board can be realized based on the package substrate 200 in the embodiment. As shown in FIG. 4, the second wiring layer 150 includes second metal wires 151-155 and the length and size of the flexible material layer 140 is larger than those of the molding compound layer 136; that is, the flexible material layer 140 extends from the molding compound layer 136. Also, if the second dielectric material layer 145 is composed of a material with low dielectric constant ($D_k$), e.g. PI and LCP, then the package substrate 200 may be applicable to the high-frequency electronic products.

The flexible material layer 140, which includes first openings 141 each formed on one of the first metal pillars 131-133 to expose the first metal pillars 131-133, is formed on the conductive pillar layer 130. The first openings 141 can be formed in the flexible material layer 140 by any proper patterning means. For example, the flexible material layer 140 may come with through-holes and with pressure sensitive adhesive on its bottom side. The flexible material layer 140 is then put on the conductive pillar layer 130 and the through-holes become the first openings 141. In another example, the flexible material layer 140 can be first laminated on the conductive pillar layer 130 and then patterned to form the first openings 141. The flexible material layer 140 can be made of flexible material, such as PI, PEN, or LCP. Because the flexible material layer 140 is bond together to the molding compound layer 136, the elasticity and flexibility of the flexible material layer 140 can prevent the molding compound layer 136 from being fragile and damaged.

The second wiring layer 150, including at least one second metal wire 151-155 and a protective layer 160, can be formed on the flexible material layer 140. Wherein, the second metal wires 151-155 are formed by patterning a metal layer acting as upper-layer conductive wires of the package substrate 200. Metal material is used to form the second wiring layer 150 and it fills the first openings 141 during the formation of the second wiring layer 150, so that the second metal wires 151, 152 and 154 are connected to the metal pillars 131, 132 and 133, respectively, through the first openings 141. In the embodiment, the metal pillars 131-133 may be made of copper, so as to electrically connect the second wiring layer 150 (the upper circuit layer) and the first wiring layer 120 (the lower circuit layer). The second wiring layer 150 may further include second openings 156 formed on the second metal wires 151, 152 and 154, respectively, by any proper patterning means, so that the package substrate 200 can be connected to an external circuit. Moreover, the protection layer 160 is formed of insulating material and surrounds the second metal wires 151-154 and the second openings 156. The protection layer 160 may be the outermost part or the bottom of the package substrate 200, so as to protect the package substrate 200 from being damaged by external objects or the subsequent fabrication process like soldering. The package substrate 200 can be a FCCSP substrate used to construct the MIS substrate.

In one embodiment, the first wiring layer 120 can be filled with the forming material of the molding compound layer 136; that is, the first dielectric material layer 126 and the molding compound layer 136 in FIG. 4 can be made of the same material.

Figure 5:
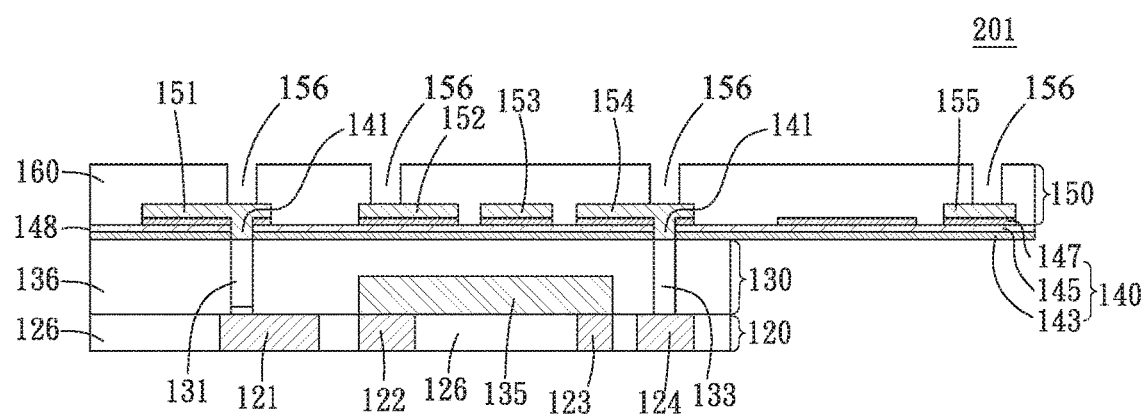
FIG. 5 schematically shows a cross-sectional view of a package substrate according to a further embodiment.

FIG. 5 schematically shows a cross-sectional view of a package substrate 201 according to a further embodiment. The package substrate 201 is in many ways identical to the package substrate 200 shown in FIG. 4. However, in contrast to the package substrate 200, the package substrate 201 includes a multi-layer circuit device 135 in the conductive pillar layer 130, e.g. MLCC, connected to the first metal wires 122 and 123 and surrounded by the molding compound layer 136.

The fabrication methods of the embodiments are provided below. FIG. 6-8, FIG. 9A, FIG. 10A, FIG. 11A and FIG. 2 are sectional views of the package substrate 100 in different steps of the fabrication method according to the first embodiment, while FIG. 6-8, FIG. 9B, FIG. 10B, FIG. 11B and FIG. 4 are sectional views of the package substrate 200 in different steps of the fabrication method according to the second embodiment.

Figure 6:
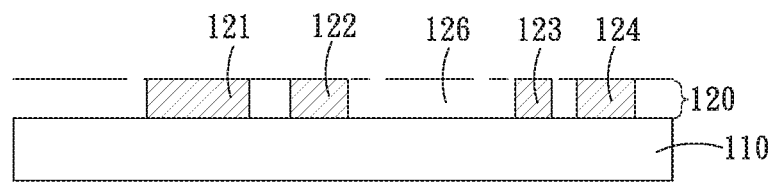
FIG. 6-8, FIG. 9A, FIG. 10A and FIG. 11A are sectional views of the package substrate in different steps of the fabrication method according to the first embodiment.

At first, a metal or fiberglass carrier substrate 110 is provided, as shown in FIG. 6, which is used for supporting electric circuits and electric components arranged thereon, such as the first wiring layer 120, the conductive pillar layer 130, the flexible material layer 140, the second wiring layer 150 and the protective layer 160 in FIG. 2 and FIG. 4. The aforesaid metal can be Fe, Fe/Ni, Cu, Al, or the composition or alloy thereof, but is not limited thereby. Next, a first metal layer is formed on the carrier 110 and then patterned to be the first metal wires 121-124, which are the lower-layer part of the conductive wires of the package substrate 100. For example, the first metal layer can be formed of Cu, Al or Ni by evaporating or electrolytic plating. It can be patterned by the photolithography to be the first metal wires 121-124. Besides, the first metal wires 121-124 can be formed by laser engraving the first metal layer. Then, the first dielectric material layer 126 is deposited on the carrier 110 to fill the first wiring layer 120 other than the occupation of the first metal wires 121-124 therein.

Figure 7:
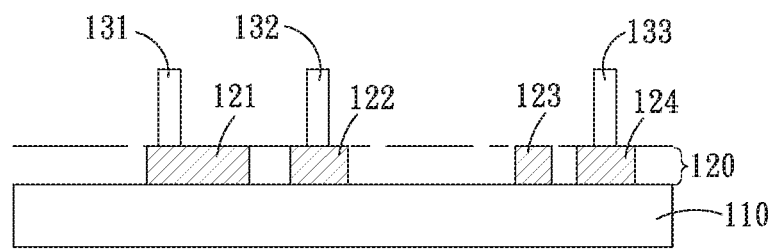

Next, a plurality of metal pillars 131-133 are formed on the first wiring layer 120 as shown in FIG. 7. The metal pillars 131-133 can be made of copper (Cu) or aluminum (Al) and used to electrically connect the first wiring layer 120 and the second wiring layer 150 to be processed in the subsequent fabrication steps. A second metal layer is formed by evaporating or electrolytic plating and then patterned by the photolithography to form the metal pillars 131-133. For example, a photoresist layer can be deposited on both the carrier 110 and the first wiring layer 120 by laminating dry film photoresist, and it would be patterned by exposure to light and developing. Then, the second metal layer is deposited on the patterned photoresist layer. By using the lift-off processing, the patterned photoresist layer can be removed out together with the part of the second metal layer directly on its top surface, and the remainder of the second metal layer not on the patterned photoresist layer stays on the first wiring layer 120 to be the metal pillars 131-133 in the conductive pillar layer 130.

Figure 8:
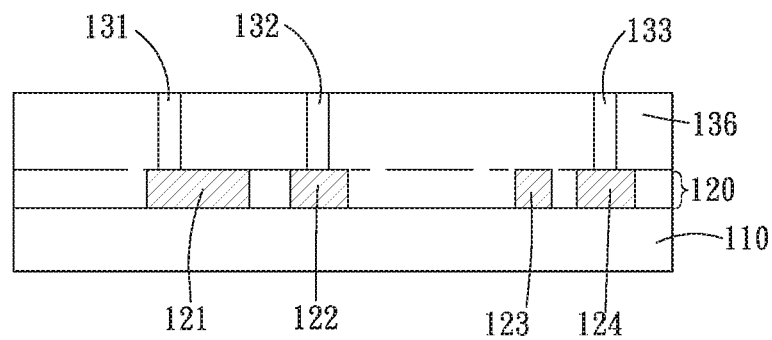

Next, a molding compound layer 136 is formed on the carrier 110 as shown in FIG. 8, and it covers all the top surface of the carrier 110 including all of the first metal wires 121-124 and the metal pillars 131-133. The molding compound layer 136 act as an isolating interposition between the first wiring layer 120 and the second wiring layer 150, and it can be formed of insulating material suitable for molding (e.g. compression molding, transferring molding, and injection molding), such as epoxy-based-resin EMC. For example, a molding compound is provided in a mold container. The mold container corresponds with the carrier 110 properly, so that the first metal wires 121-124 and the metal pillars 131-133 are all located between the mold container and the carrier 110. Then, a downward pressure is applied to the carrier 110 and an upward pressure is applied to the mold container. The pressures are maintained until the molding compound has cured to be the molding compound layer 136. The mold container can be removed after that. The molding compound can be made of insulating material such as novolac-based resin, epoxy-based resin, and silicone-based resin; but is not limited thereto. In the embodiment, epoxy-based-resin EMC is used for the molding compound layer 136.

The molding compound layer 136 is then partly removed, so that the metal pillars 131-133 have exposed top faces as shown in FIG. 8. It can be performed by polishing, grinding, sandblasting, plasma or chemical etching, to remove the upper part of the first molding compound 136 in a top-down manner until the top faces of the plural metal pillars 131-133 are exposed out of the covering of the first molding compound 136. Here, the metal pillars 131-133 and the molding compound layer 136 are combined to be the conductive pillar layer 130.

Figure 9A:
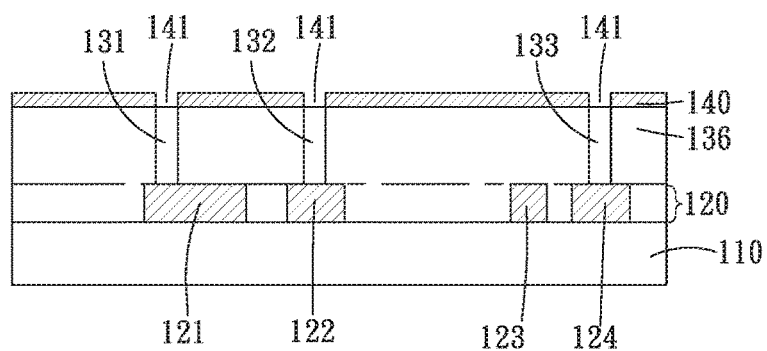

Next, a flexible material layer 140 is formed on the conductive pillar layer 130 and then partly removed to expose the top faces of the plural metal pillars 131-133, as shown in FIG. 9A. For example, the flexible material layer 140 can be formed by spin-coating or other laminating means used in the integrated-circuit manufacturing, and then patterned by the photolithography. The flexible material layer 140 can be made of flexible material, such as PI, PEN, or LCP. Because the flexible material layer 140 is bond together to the molding compound layer 136, the elasticity and flexibility of the flexible material layer 140 can prevent the molding compound layer 136 from being fragile and damaged.

Figure 10A:
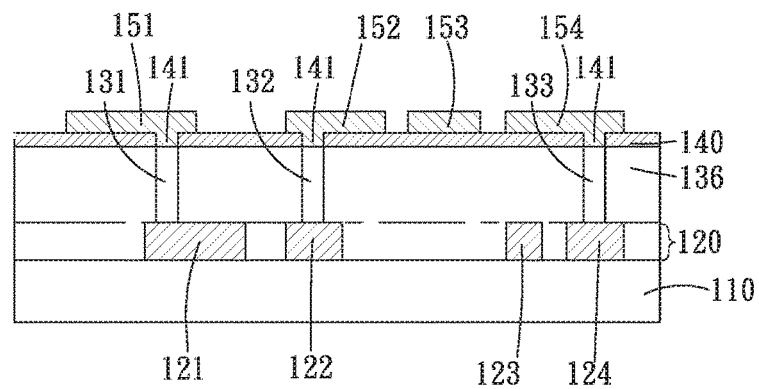

Next, a second metal layer is formed on the flexible material layer 140 and the exposed top faces of the plural metal pillars 131-133, and then patterned to be the second metal wires 151-154, which are the upper-layer part of the conductive wires of the package substrate 100. For example, the second metal layer can be formed of Cu, Al or Ni by evaporating or electrolytic plating. It can be patterned by the photolithography to be the second metal wires 151-154 as shown in FIG. 10A. Thereby, the second metal wires 151, 152 and 154 are respectively connected to the metal pillars 131, 132 and 133.

Figure 11A:
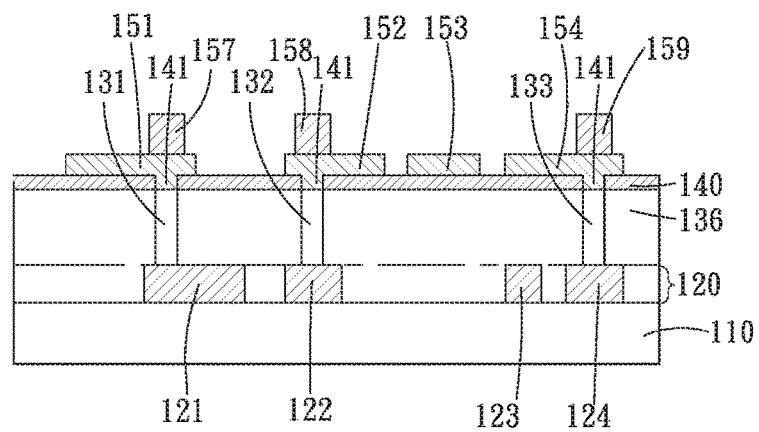

Next, a plurality of metal pillars 157, 158 and 159 are formed on the second metal wires 151, 152 and 154, respectively, as shown in FIG. 11A. The metal pillars 157, 158 and 159 can be made of Cu or Al and used to electrically connect the package substrate 100 with an external circuit or electronic components. The metal pillars 157, 158 and 159 can be formed by metal evaporating or electrolytic plating and then patterned by the photolithography.

Next, a protection layer 160 is formed on the metal pillars 157-159, the second metal wires 151, 152 and 154, and the flexible material layer 140, as shown in FIG. 2. The protection layer 160 is used to electrically insulate the neighboring conductive wires in the second wiring layer 150 and to protect the second wiring layer 150 from being damaged by external objects or the subsequent fabrication process. At last, the carrier 110 is totally removed to obtain the package substrate 100 in the embodiment, or partly removed to obtain a package structure in another embodiment. Here, the forming material of the first dielectric layer 126 may be selected to be that of the molding compound layer 136.

Figure 12:
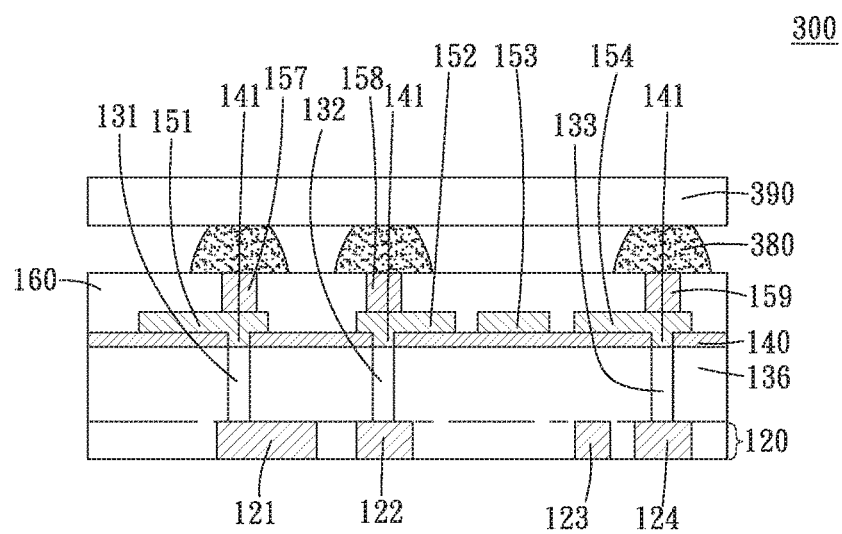
FIG. 12 schematically shows a cross-sectional view of a package structure device according to a third embodiment of the present disclosure.

The package substrate 100 of the first embodiment can be further processed to fabricate a package structure device. FIG. 12 schematically shows a cross-sectional view of a package structure device 300 according to a third embodiment of the present disclosure. The package structure device 300 includes a package substrate and an electronic component 390. The package substrate is basically the package substrate 100 in FIG. 2. The electronic component 390 can be an active device, a passive device, or their combination. The electronic component 390 is bonded to the second metal wires 151, 152 and 154 through the metal pillars 157-159 and the electrical connection members (e.g. the solder balls 380 as shown in FIG. 12) thereon.

With respect to the second embodiment, FIG. 6-8, FIG. 9B, FIG. 10B, FIG. 11B and FIG. 4 are sectional views of the package substrate 200 in different fabrication steps. Wherein, the steps in FIG. 6-8 are identical to those in the first embodiment and not recited redundantly.

In the embodiment, the flexible material layer 140 has a multi-layer structure including an adhesive layer 143, a second dielectric material layer 145, and a conductive material layer 147. For example, the flexible material layer 140 is an FCCL, in which the second dielectric material layer 145 is formed of PI or LCP, and the conductive material layer 147 is formed of Cu. Because the second dielectric material layer 145 can act as a substrate mechanically supporting conductive tracks, e.g. the second metal wires 151-155, a rigid-flex printed-circuit board can be realized based on the package substrate 200 in the embodiment.

Figure 9B:
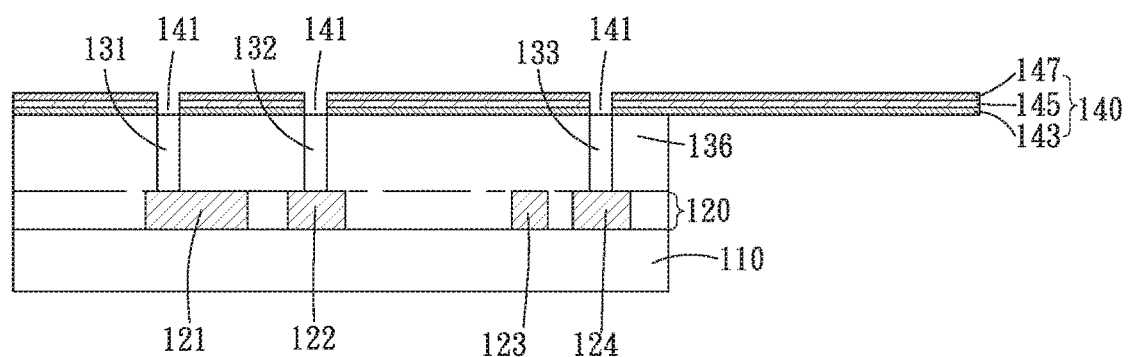

As shown in FIG. 9B, the flexible material layer 140 is formed on the conductive pillar layer 130 and includes first openings 141 each formed on one of the first metal pillars 131-133 to expose the first metal pillars 131-133. The first openings 141 can be formed in the flexible material layer 140 by any proper patterning means. For example, the flexible material layer 140 may come with through-holes and with pressure sensitive adhesive on its bottom side. The flexible material layer 140 is then put on the conductive pillar layer 130 and the through-holes become the first openings 141. Alternatively, the flexible material layer 140 can be first laminated on the conductive pillar layer 130 and then patterned to form the first openings 141. Because the flexible material layer 140 is bond together to the molding compound layer 136, the elasticity and flexibility of the flexible material layer 140 can prevent the molding compound layer 136 from being fragile and damaged.

Figure 10B:
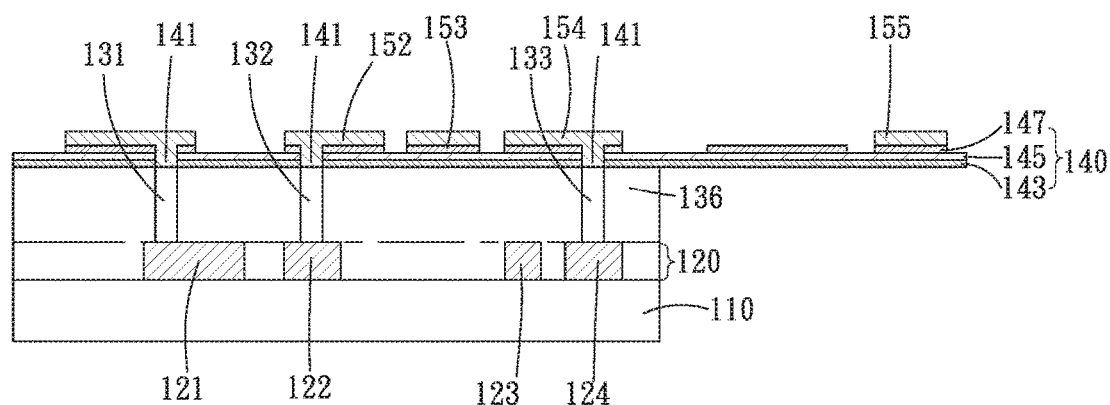

Next, as shown in FIG. 10B, a second metal layer is formed on the flexible material layer 140 and the exposed top faces of the plural metal pillars 131-133, and then patterned to be the second metal wires 151-155, which are the upper-layer part of the conductive wires of the package substrate 200. For example, the second metal layer can be formed of Cu, Al or Ni by evaporating or electrolytic plating. It can be patterned by the photolithography to be the second metal wires 151-155. Thereby, the second metal wires 151, 152 and 154 are respectively connected to the metal pillars 131, 132 and 133.

Figure 11B:
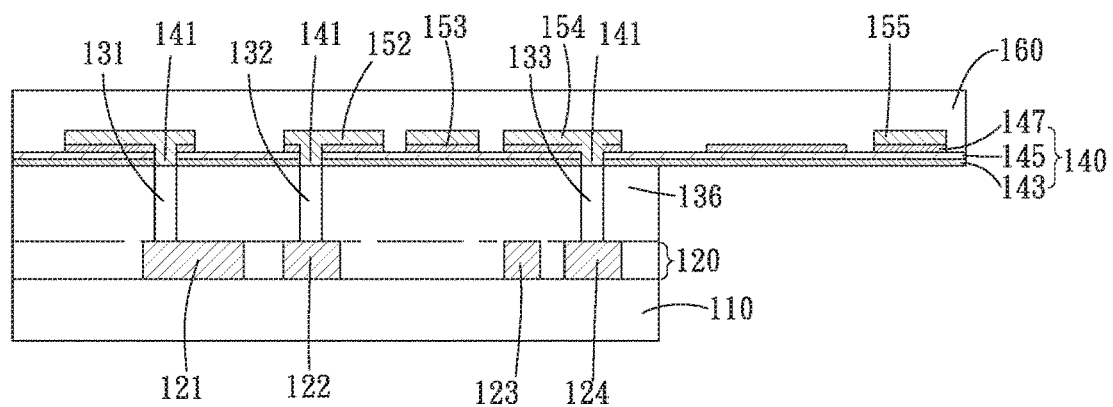

As shown in FIG. 11B, a protection layer 160 is then formed on the second metal wires 151-155 and the flexible material layer 140. The protection layer 160 is used to electrically insulate the neighboring conductive wires in the second wiring layer 150 and to protect the second wiring layer 150 from being damaged by external objects or the subsequent fabrication process.

Next, second openings 156 are formed on the second metal wires 151, 152, and 154 by any proper patterning means as shown in FIG. 4. The second openings 156 are used as channels connecting the package substrate 200 to an external circuit. At last, the carrier 110 is removed to obtain the package substrate 200 in the embodiment; wherein the forming material of the first dielectric layer 126 may be selected to be that of the molding compound layer 136.

Figure 13:
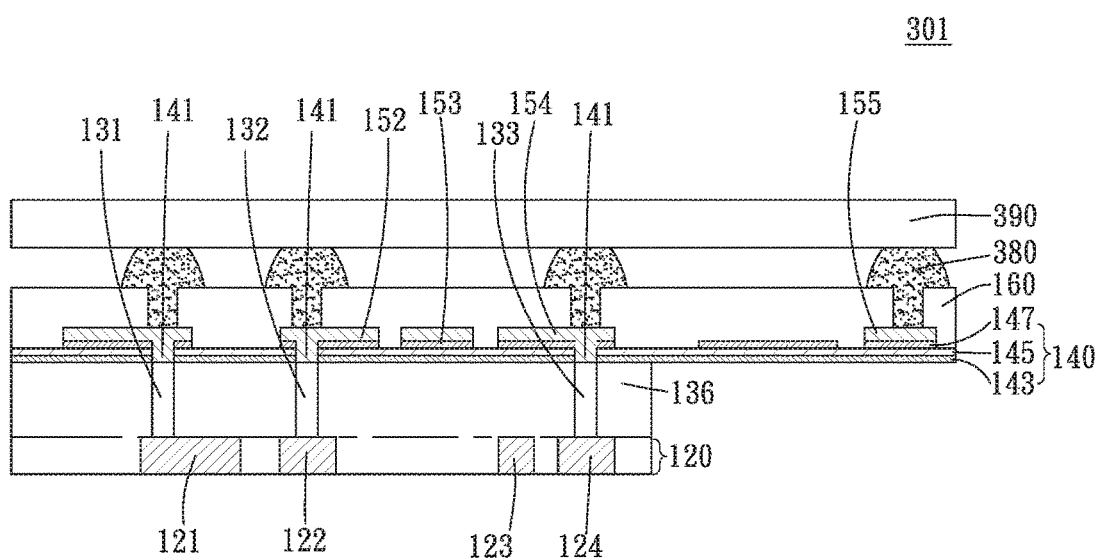
FIG. 13 schematically shows a cross-sectional view of a package structure device according to a fourth embodiment of the present disclosure.

The package substrate 200 of the second embodiment can be further processed to fabricate a package structure device. FIG. 13 schematically shows a cross-sectional view of a package structure device 301 according to a fourth embodiment of the present disclosure. The package structure device 301 includes a package substrate and an electronic component 390. The package substrate is basically the package substrate 200 in FIG. 4. The electronic component 390 can be an active device, a passive device, or their combination. The electronic component 390 is bonded to the metal wires 151, 152 and 154 through the second openings 156 and the electrical connection members (e.g. the solder balls 380 as shown in FIG. 13) thereon.

With respect to the above description then, it is to be realized that the optimum dimensional relationships for the parts of the invention, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present invention.

What is claimed is:
1. A method for fabricating a package structure, comprising the steps of:
   (A) providing a carrier;
   (B) forming a metal wiring layer on the carrier, and patterning the metal wiring layer to form a first metal wire;
   (C) forming a first dielectric material layer on the carrier while enabling the first metal wire to be exposed;
   (D) forming a metal pillar on the first dielectric material layer, so that the metal pillar is electrically connected to the first metal wire;
   (E) forming a molding compound layer on the first dielectric material layer while enabling an upper surface of the metal pillar to be exposed;
   (F) forming a flexible material layer on the molding compound layer while enabling the upper surface of the metal pillar to be exposed, wherein the flexible material layer has a surface area larger than that of the molding compound layer so that the flexible material layer has an extension part extending from the molding compound layer without covering the first metal wire;

(G) forming a second metal wire on the flexible material layer and on the upper surface of the metal pillar, so that the second metal wire is connected to the metal pillar; and (H) forming a protective layer to cover the flexible material layer and the second metal wire, and forming an opening to expose the second metal wire.

2. The method of claim 1, further comprising a step of:

disposing an electronic device on the protective layer and electrically connecting the electronic device with the second metal wire through the opening of the protective layer.

3. The method of claim 1, wherein the flexible material layer comprises polyimide, polyethylene naphthalate (PEN), or liquid crystal plastic.

4. A method for fabricating a package structure, comprising the steps of:

(A) providing a carrier;

(B) forming a metal wiring layer on the carrier, and patterning the metal wiring layer to form a first metal wire;

(C) forming a first dielectric material layer on the carrier while enabling the first metal wire to be exposed;

(D) forming a metal pillar on the first dielectric material layer, so that the metal pillar is electrically connected to the first metal wire;

(E) forming a molding compound layer on the first dielectric material layer while enabling an upper surface of the metal pillar to be exposed;

(F) forming a flexible material layer on the molding compound layer while enabling the upper surface of the metal pillar to be exposed, wherein the flexible material layer has a surface area larger than that of the molding compound layer so that the flexible material layer has an extension part extending from the molding compound layer without covering the first metal wire;

(G) forming a second metal wire on the flexible material layer and on the upper surface of the metal pillar, so that the second metal wire is connected to the metal pillar;

(H) forming a protective layer to cover the flexible material layer and the second metal wire, and forming an opening to expose the second metal wire; and (I) electrically connecting a multilayer capacitor to the first metal wire.

5. The method of claim 4, further comprising a step of:

disposing an electronic device on the protective layer and electrically connecting the electronic device with the second metal wire through the opening of the protective layer.

6. The method of claim 4, wherein the flexible material layer comprises polyimide, polyethylene naphthalate (PEN), or liquid crystal plastic.

* * * * *